United States Patent
Shimatou (10) Patent No.: US 8,476,134 B2
(45) Date of Patent: Jul. 2, 2013

(54) METHOD OF MANUFACTURING SUPER-JUNCTION SEMICONDUCTOR DEVICE

(75) Inventor: Takayuki Shimatou, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 154 days.

(21) Appl. No.: 13/111,481

(22) Filed: May 19, 2011

(65) Prior Publication Data

US 2011/0287598 A1     Nov. 24, 2011

(30) Foreign Application Priority Data

May 20, 2010    (JP) .................................. 2010-116561

(51) Int. Cl.
H01L 21/336    (2006.01)

(52) U.S. Cl.
USPC ......................................... 438/270; 438/272

(58) Field of Classification Search
None
See application file for complete search history.

(56) References Cited

U.S. PATENT DOCUMENTS

| | | | |
|---|---|---|---|
| 6,982,459 B2 * | 1/2006 | Suzuki et al. ................. | 257/329 |
| 7,037,789 B2 * | 5/2006 | Yamauchi et al. ............ | 438/270 |
| 7,777,316 B2 * | 8/2010 | Ishida et al. .................. | 257/678 |
| 2005/0006699 A1 * | 1/2005 | Sato et al. ..................... | 257/327 |
| 2006/0011962 A1 * | 1/2006 | Kocon .......................... | 257/302 |
| 2008/0102582 A1 * | 5/2008 | Takei ............................ | 438/270 |
| 2008/0185640 A1 * | 8/2008 | Nakagawa .................... | 257/330 |
| 2011/0156139 A1 * | 6/2011 | Hsieh ............................ | 257/331 |
| 2011/0241111 A1 * | 10/2011 | Tamaki et al. ................ | 257/342 |

FOREIGN PATENT DOCUMENTS

| | | |
|---|---|---|
| JP | 2003-124464 | 4/2003 |
| JP | 2007-194585 | 8/2007 |
| JP | 2009-200300 | 9/2009 |

* cited by examiner

*Primary Examiner* — Scott B Geyer

(57) ABSTRACT

A method of manufacturing a super-junction semiconductor device includes growing an alternating conductivity type layer epitaxially on a heavily doped n-type semiconductor substrate, the alternating conductivity type layer including n-type and p-type semiconductor regions arranged alternately and repeated such that n-type and p-type regions are adjoining each other, and arranged to extend perpendicular to the substrate's major surface. The method includes forming a first trench having a predetermined depth in the surface portion of n-type semiconductor region; forming an n-type thin layer on the inner surface of the first trench; and burying gate electrode in the space surrounded by the n-type thin layer with a gate insulator film interposed between a gate electrode and the n-type thin layer.

18 Claims, 7 Drawing Sheets

METHOD OF MANUFACTURING SUPER-JUNCTION SEMICONDUCTOR DEVICE

CROSS-REFERENCE TO RELATED APPLICATIONS

This application claims the priority benefit of Japanese Patent Application No. 2010-116561, filed on May 20, 2010, in the Japanese Intellectual Property Office, the disclosure of which is incorporated herein by reference.

BACKGROUND

1. Field

The present invention relates to a method of manufacturing a semiconductor device that includes a drift layer having a super-junction structure formed of an alternating conductivity type layer including n-type regions and p-type regions arranged alternately (hereinafter referred to as a "super-junction semiconductor device" and abbreviated to "SJ semiconductor device"). Specifically, the invention relates to a method of manufacturing an SJ MOS semiconductor device having a trench-gate structure.

2. Description of the Related Art

Figure 5A:
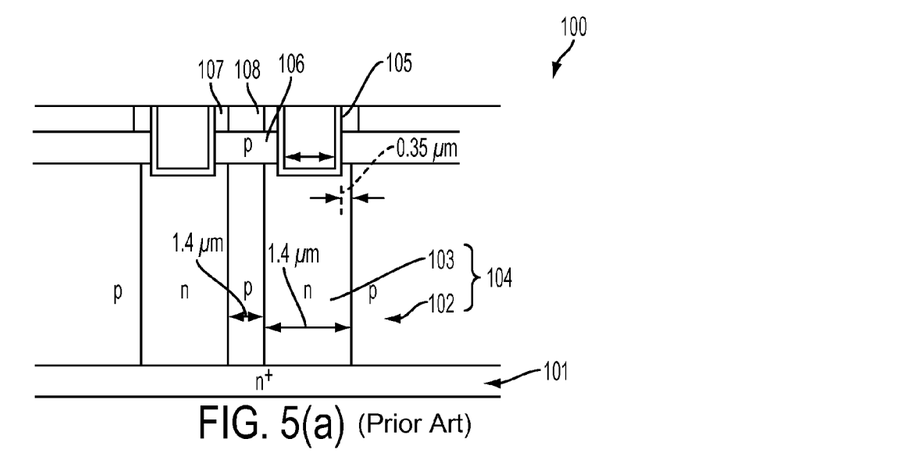
FIG. 5(a) is the cross sectional view of an alternating conductivity type layer in a conventional trench-gate SJ-MOSFET describing the typical dimensions of the constituent regions.

The SJ MOS semiconductor device, the cross sectional view thereof is shown in FIG. 5(a), is a SJ-MOSFET provided with a trench-gate structure. The trench-gate SJ-MOSFET shown in FIG. 5(a) includes $n^+$ silicon semiconductor substrate 101 and a drift layer on $n^+$ silicon semiconductor substrate 101. The drift layer includes alternating-conductivity-type layer 104 including p-type region 102 and n-type region 103, both extending in perpendicular to the substrate 101 major surface. Regions corresponding to p-type region 102 and n-type region 103 are arranged alternately and repeatedly in parallel to the substrate 101 major surface such that p-type region 102 and n-type region 103 are adjoining to each other.

The trench-gate SJ-MOSFET further includes trench gate 105, the bottom thereof is positioned in the upper portion of n-type region 103, and p-type channel region 106 on alternating-conductivity-type layer 104. The p-type channel region 106 is sandwiched between trench gates 105. The trench-gate SJ-MOSFET also includes $n^+$ source region 107 and $p^+$ contact region 108, both on p-type channel region 106. The $n^+$ source region 107 is in contact with the trench gate 5 side wall. The $p^+$ contact region 108 is sandwiched between $n^+$ source regions 107. Trench-gate SJ-MOSFET 100 has the structure as described above.

In manufacturing trench-gate SJ-MOSFET 100, a p-type epitaxial layer is usually formed on the entire upper surface of heavily doped $n^+$ silicon semiconductor substrate 101. A plurality of third trenches (the trenches for forming alternating conductivity type layer 104) deep enough to reach $n^+$ silicon semiconductor substrate 101 is formed through the p-type epitaxial layer. An n-type epitaxial layer is buried in the third trenches to form buried n-type regions 103. The portions of the p-type epitaxial layer remaining between the third trenches provide p-type regions 102. The layer structure, in which a couple of p-type region 102 and n-type region 103 adjoining to each other is repeated, provides alternating conductivity type layer 104 having a super-junction structure specific to the drift layer in the SJ semiconductor device.

From the surface of each n-type region 103 in alternating conductivity type layer 104, a second trench (a trench for forming a trench gate) narrower than n-type region 103 is formed. Then, a trench gate structure is formed by burying a gate electrode made from polycrystalline silicon and such a material exhibiting low electrical resistance in the second trench with a gate insulator film interposed between the second trench and the gate electrode.

Then, p-type channel region 106 is formed in the surface portion of alternating conductivity type layer 104 such that p-type channel region 106 is positioned more shallowly than the second trench. Further, $p^+$ contact region 108 is formed in the surface portion of p-type channel region 106. Furthermore, $n^+$ source region 107 is formed in the surface portion of $p^+$ contact region 108 such that $n^+$ source region 107 is in contact with the second trench side wall. Thus, the second trench for forming trench gate 105 is set to be narrower than the third trench for forming n-type region 103.

Figure 5B:
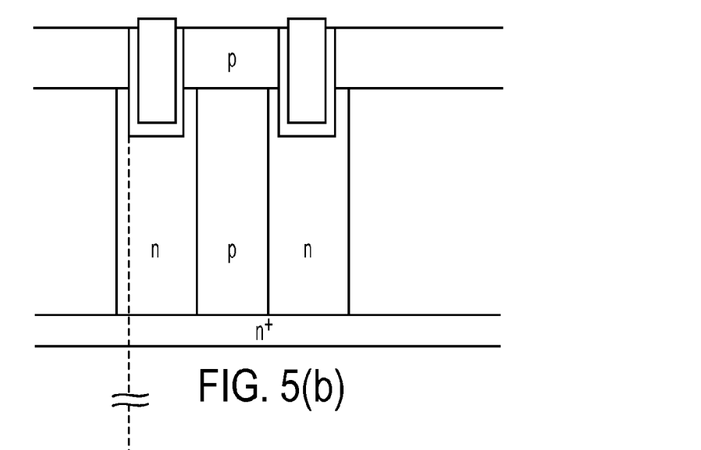
FIG. 5(b) is the cross sectional view of an alternating conductivity type layer manufactured by the multi-step epitaxial growth method, in which the trench gate is positioned properly in the n-type region in the alternating conductivity type layer.

If trench gate 105 is arranged properly in the upper portion of n-type region 103, the portions of n-type region 103 on both sides of trench gate 105 will be almost the same in width. If the layer arrangement described above is formed by the multi-step epitaxial growth method, the arrangement deviation as described in FIG. 5(c) will be liable and the proper arrangement as described in FIG. 5(b) will be obtained hardly. If the arrangement deviates from the proper one, the ON-state resistance will increase.

For obviating the problems caused by the arrangement deviation as described above, Japanese Unexamined Patent Application Publication Nos. 2009-200300 and 2003-124464 propose a method of manufacturing a semiconductor device that prevents the arrangement deviation from causing by using a same oxide film mask for the mask to form the third trench for forming n-type region 103 in alternating conductivity type layer 104 and for the mask to form the second trench for forming the trench gate.

If the widths of the third and second trenches are the same, p-type region 102 in alternating conductivity type layer 104 will be in contact with the trench gate inevitably. Therefore, a channel is caused in the portion of p-type region 102 in contact with the trench gate, elongating the channel length and increasing the ON-state resistance.

Figure 6:
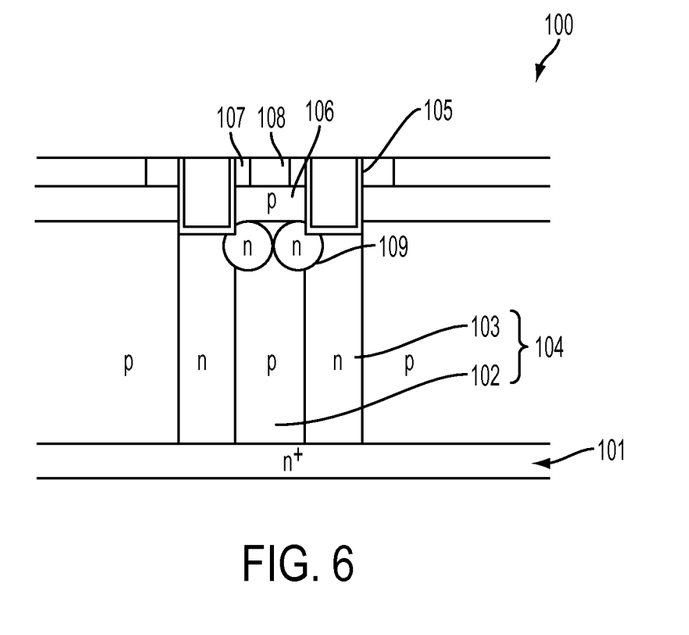
FIG. 6 is a cross sectional view describing the n-type buffer regions disposed for avoiding the ON-state resistance increase in the portion, in which the p-type region and the trench gate side wall are in contact with each other.

For avoiding the ON-state resistance increase, it is necessary to form n-type buffer region 109 by ion implantation and by thermal diffusion, as shown in FIG. 6, in the portion in which p-type region 102 and the trench gate 105 side wall are in contact with each other. However, buffer region 109 expands easily by diffusion and overlaps the adjacent buffer region 109 easily. If adjacent buffer regions 109 overlap each other, p-type region 102 in alternating conductivity type layer 104 is separated from p-type channel region 106, resulting in a floating potential state. If p-type region 102 is brought into a floating potential state, the breakdown voltage will be unstable. If adjacent buffer regions 109 are spaced apart from each other so as not to overlap each other, it will be hazardous for reducing the repeating pitch in alternating conductivity type layer 104.

For avoiding the problems caused by setting the second trench and the third trench to be the same in width, it is necessary to set the mask for forming the third trench to be wider than the mask for forming the second trench. However, if the mask for forming the third trench is set to be wider than the mask for forming the second trench simply, the problem of mask alignment deviation will not be obviated as described above.

Figure 5C:
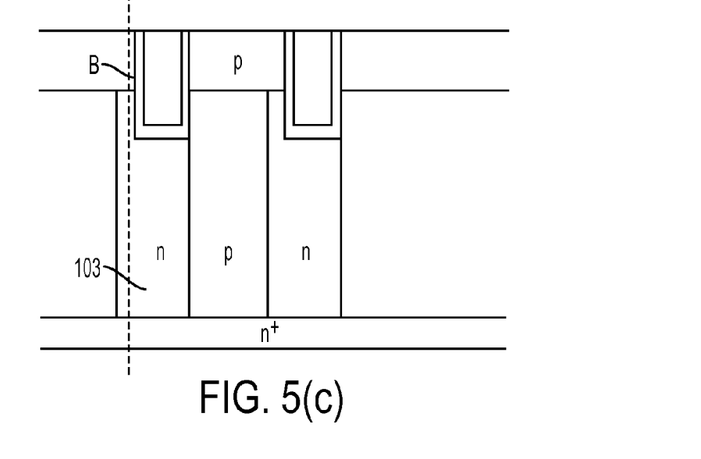
FIG. 5(c) is the cross sectional view of an alternating conductivity type layer manufactured by the multi-step epitaxial growth method, in which a mutual positional deviation is caused between the trench gate and the n-type region in the alternating conductivity type layer.

If the mask used to form the second trench for forming the trench gate deviates from the proper position, the portions of n-type region 103 on both sides of the trench gate trench will not be the same in width as shown in FIG. 5(c). The portion of n-type region 103 on one side of the trench gate trench will be extremely narrow or no longer remaining. As a result, the channel resistance or the JFET resistance will increase and the ON-state resistance may increase.

If one wants to prevent a mask alignment deviation in the conventional structure, it is necessary to consider a certain mask alignment deviation in determining the n-type region 103 width and to set the n-type region 103 width to be wider by the mask alignment deviation considered. However, the n-type region 103 width set to be wider is hazardous for reducing the repeating pitch in alternating conductivity type layer 104 due to the restriction by the size rule of the second trench on the surface structure.

In view of the foregoing, it is a first object of the invention to obviate the problems described above. It is a second object of the invention to provide a method of manufacturing a super-junction semiconductor device that facilitates preventing the mutual positional deviation from causing between the region of a first conductivity type in an alternating conductivity type layer and the second trench for forming a trench gate. It is a third object of the invention to provide a method of manufacturing a super-junction semiconductor device that facilitates preventing the ON-state resistance from increasing greatly without causing any hazard for reducing the repeating pitch in the alternating conductivity type layer, even if the second trench for forming a trench gate is displaced for more than the width of the region of the first conductivity type in an alternating conductivity type layer.

SUMMARY

According to an aspect of the invention, there is provided a method of manufacturing a super-junction semiconductor device, the method including the steps of:

growing an alternating conductivity type layer epitaxially on a heavily doped semiconductor substrate of a first conductivity type, the alternating conductivity type layer including a first semiconductor regions of the first conductivity type and a second semiconductor region of a second conductivity type, the first and second semiconductor regions extending in perpendicular to the major surface of the semiconductor substrate, the first and second semiconductor regions being arranged alternately and repeatedly in parallel to the major surface of the semiconductor substrate such that the first and second semiconductor regions are adjoining to each other;

forming a first trench having a predetermined depth in the surface portion of the first semiconductor regions;

forming a thin layer of the first conductivity type on the inner surface of the first trench for forming a second trench surrounded by the thin layer of the first conductivity type; and burying a gate electrode in the second trench with a gate oxide film interposed between the gate electrode and the second trench.

Preferably, the step of forming the alternating conductivity type layer includes a multi-step epitaxial growth that repeats the step of epitaxially growing a same alternating conductivity type layer pattern multiple times.

Preferably, the step of forming the alternating conductivity type layer includes growing an epitaxial layer of the second conductivity type for a predetermined thickness on the semiconductor substrate; forming a third trench for forming the first semiconductor region, the third trench being extended from the surface of the epitaxial layer of the second conductivity type to the semiconductor substrate; and burying an epitaxial layer of the first conductivity type in the third trench.

Preferably, a same insulator film mask is used for forming the third trench and for forming the first trench.

Preferably, the epitaxial layer of the first conductivity type is selectively grown epitaxially from the bottom of the third trench and the epitaxial growth of the epitaxial layer of the first conductivity type is stopped at a predetermined height for forming the first trench having the predetermined depth.

Preferably, the first trench for forming the trench gate is set to be narrower than the first semiconductor region in the alternating conductivity type layer.

Preferably, the super-junction semiconductor device is a super-junction MOSFET.

According to embodiments of the invention, the mutual positional deviation between the first semiconductor region of the first conductivity type in the alternating conductivity type layer and the second trench for forming the trench gate is prevented from causing. Even if the second trench for forming the trench gate deviates from the proper position for more than the first semiconductor region width, the ON-state resistance is prevented from increasing. Therefore, a method of manufacturing a super-junction semiconductor device that is not hazardous for minimizing the repeating pitch of the couple of the first and second semiconductor regions in the alternating conductivity type layer is obtained.

BRIEF DESCRIPTION OF THE DRAWINGS

These and/or other aspects and advantages will become apparent and more readily appreciated from the following description of embodiments, taken in conjunction with the accompanying drawings of which.

DESCRIPTION OF EMBODIMENTS

Now embodiments of the invention will be described in detail hereinafter with reference to the accompanied drawings which illustrate the preferred embodiments of the invention. Although the invention will be described in connection with the embodiments thereof, changes and modifications are obvious to the persons skilled in art without departing from the true spirits of the invention.

First Embodiment

Now a method of manufacturing a trench-gate SJ-MOSFET according to a first embodiment of the invention will be described below with reference to FIGS. 1(a) through 1(g). According to the first embodiment of the invention, a trench-gate SJ-MOSFET is manufactured by a method that includes a process of forming an alternating conductivity type layer having a super-junction structure by filling trenches by epitaxial growth (hereinafter referred to as "trench-filling epitaxial growth").

Figure 1A:
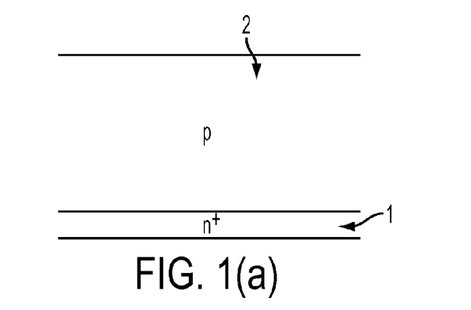
FIG. 1(a) is a first cross sectional view describing the process of manufacturing a trench-gate SJ-MOSFET according to a first embodiment of the invention.

Referring at first to FIG. 1(a), p-type silicon semiconductor layer 2 is formed by epitaxial growth on $n^+$ silicon semiconductor substrate 1.

Figure 1B:
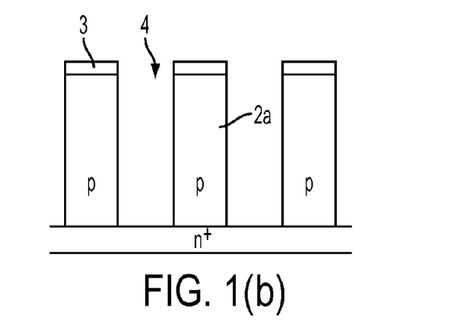
FIG. 1(b) is a second cross sectional view describing the process of manufacturing the trench-gate SJ-MOSFET according to the first embodiment.

Referring now to FIG. 1(b), an insulator film such as an oxide film is deposited on p-type silicon semiconductor layer 2. Third trench 4 for forming an alternating conductivity type layer is formed using oxide film mask 3 patterned with a predetermined pattern such that third trench 4 is deep enough to reach $n^+$ silicon semiconductor substrate 1. The p-type silicon semiconductor layer 2 remaining beneath oxide film mask 3 works as p-type region 2a.

Figure 1C:
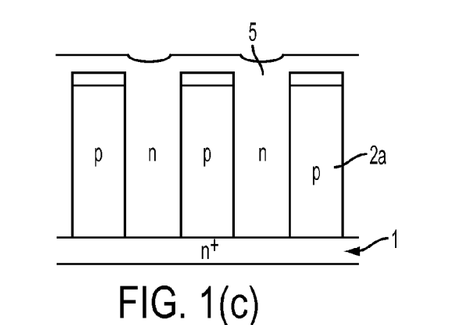
FIG. 1(c) is a third cross sectional view describing the process of manufacturing the trench-gate SJ-MOSFET according to the first embodiment.

Referring now to FIG. 1(c), n-type silicon semiconductor layer 5 is buried in third trench 4 by epitaxial growth.

Figure 1D:
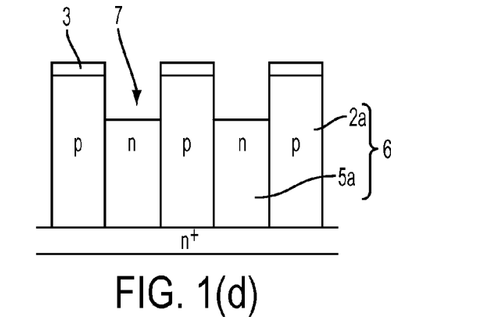
FIG. 1(d) is a fourth cross sectional view describing the process of manufacturing a trench-gate SJ-MOSFET according to the first embodiment.

Referring now to FIG. 1(d), n-type silicon semiconductor layer 5 deposited on the upper side of oxide film mask 3 is removed by chemical mechanical polishing (hereinafter referred to as "CMP"). With oxide film mask 3 left unremoved, n-type silicon semiconductor layer 5 is over etched to form n-type region 5a lower than p-type region 2a. Thus, alternating conductivity type layer 6 including p-type region 2a and n-type region 5a is formed. The space above n-type region 5a and between p-type regions 2a is employed as first trench 7.

Figure 1E:
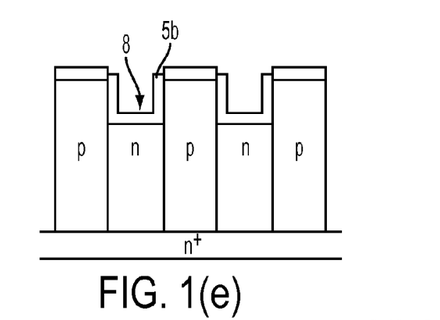
FIG. 1(e) is a fifth cross sectional view describing the process of manufacturing the trench-gate SJ-MOSFET according to the first embodiment.

Referring now to FIG. 1(e), n-type silicon semiconductor thin layer 5b is grown epitaxially on the side wall and bottom of first trench 7 such that n-type silicon semiconductor thin layer 5b is the same in thickness on the side wall and bottom of first trench 7. The internal space surrounded by n-type silicon semiconductor thin layer 5b is employed as second trench 8.

The mutual positional relation between first trench 7 and second trench 8 is adjusted in a self-aligning manner without employing any mask alignment technique. Therefore, the manufacturing method according to the first embodiment of the invention is characterized in that the manufacturing method according to the first embodiment does not cause any mask alignment deviation.

Figure 1F:
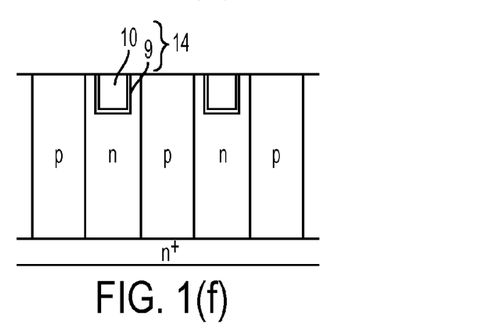
FIG. 1(f) is a sixth cross sectional view describing the process of manufacturing the trench-gate SJ-MOSFET according to the first embodiment.

Referring now to FIG. 1(f), gate oxide film 9 is grown in second trench 8 and gate electrode 10 is formed by depositing a material that exhibits low electrical resistance such as polycrystalline silicon on gate oxide film 9. Thus, trench gate 14 is formed.

Figure 1G:
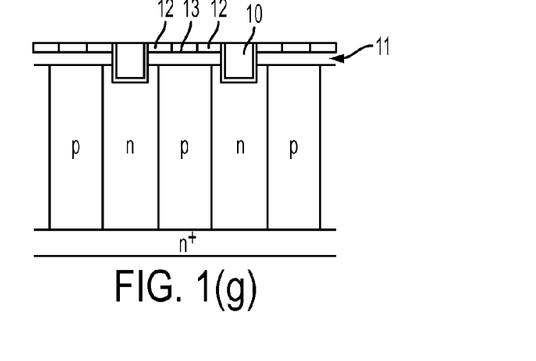
FIG. 1(g) is a seventh cross sectional view describing the process of manufacturing the trench-gate SJ-MOSFET according to the first embodiment.

Referring now to FIG. 1(g), p-type channel region 11 is formed in the surface portion of the alternating conductivity type layer between trench gates 14. Further, $n^+$ source region 12 and $p^+$ contact region 13 are formed in the surface portion of p-type channel region 11.

Thus, the trench-gate SJ-MOSFET according to the first embodiment of the invention is manufactured.

By the manufacturing method according to the first embodiment of the invention, n-type region 5a in the alternating conductivity type layer and first trench 7 for forming a trench gate are formed by using a same oxide film mask. Therefore, n-type region 5a and first trench 7 are arranged properly in a self-aligning manner and any mutual positional deviation is not caused.

Second Embodiment

Now a method of manufacturing a trench-gate SJ-MOSFET according to a second embodiment of the invention will be described below with reference to FIGS. 2(a) through 2(f). According to the second embodiment, a trench-gate SJ-MOSFET is manufactured by a method that includes a process of forming an alternating conductivity type layer by multi-step epitaxial growth.

The multi-step epitaxial growth method is a method that repeats epitaxial growth and selective ion implantation multiple times until a drift layer of a predetermined thickness is obtained such that the drift layer is formed of an alternating conductivity type layer including a p-type region and an n-type region, extended in perpendicular to the major surface of an n+ silicon semiconductor substrate, arranged alternately and repeatedly in parallel to the major surface of an n+ silicon semiconductor substrate, and adjoining to each other. The multi-step epitaxial growth method is well known to the persons skilled in the art.

Figure 2A:
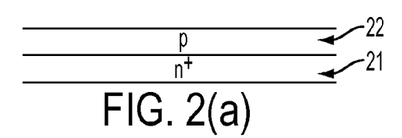
FIG. 2(a) is a first cross sectional view describing the process of manufacturing a trench-gate SJ-MOSFET according to a second embodiment of the invention.

At the start of forming alternating conductivity type layer 28 by the multi-step growth method, p-type silicon semiconductor layer 22 is grown epitaxially on n+ silicon semiconductor substrate 21 as shown in FIG. 2(a).

Figure 2B:
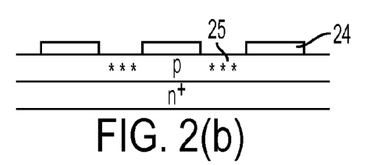
FIG. 2(b) is a second cross sectional view describing the process of manufacturing the trench-gate SJ-MOSFET according to the second embodiment.

Referring now to FIG. 2(b), a not-shown screen oxide film mask is formed in the surface portion of p-type silicon semiconductor layer 22. Then, predetermined resist pattern 24 is formed as a mask for ion implantation. Then, n-type ions are implanted selectively through the resist opening to form n-type ion-implanted layer 25.

Figure 2C:
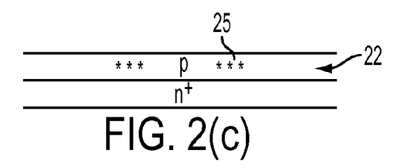
FIG. 2(c) is a third cross sectional view describing the process of manufacturing the trench-gate SJ-MOSFET according to the second embodiment.

Referring now to FIG. 2(c), resist pattern 24 and the screen oxide film (not shown) are removed.

Figure 2D:
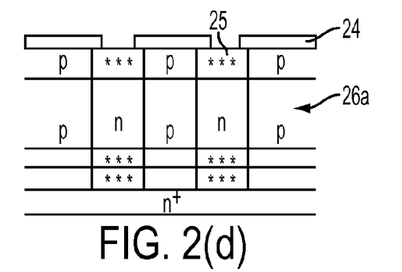
FIG. 2(d) is a fourth cross sectional view describing the process of manufacturing a trench-gate SJ-MOSFET according to the second embodiment of the invention.

Referring now to FIG. 2(d), the steps described with reference to FIGS. 2(a) through 2(c) are repeated multiple times to lay p-type region 26a and n-type ion-implanted layer 25 on p-type region 26a and n-type ion-implanted layer 25, respectively, until a thickness necessary for realizing a desired breakdown voltage is obtained.

Figure 2E:
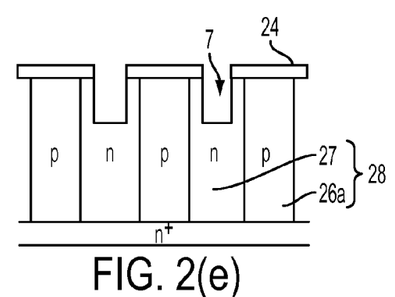
FIG. 2(e) is a fifth cross sectional view describing the process of manufacturing the trench-gate SJ-MOSFET according to the second embodiment.

Referring now to FIG. 2(e), resist pattern 24 is removed. Then, thermal drive is conducted to form alternating conductivity type layer 28 including p-type region 26a and n-type region 27. Then, resist pattern 24 is formed again and first trench 7 is formed using resist pattern 24 as an etching mask. The opening width in first trench 7 is set to be narrower than the n-type region 27 width.

Figure 2F:
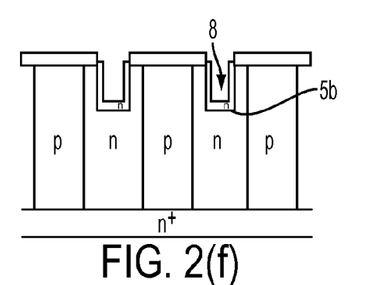
FIG. 2(f) is a sixth cross sectional view describing the process of manufacturing the trench-gate SJ-MOSFET according to the second embodiment.

Referring now to FIG. 2(f), n-type silicon semiconductor thin layer 5b is grown epitaxially on the bottom and side wall of first trench 7 to leave second trench 8 in the same manner as according to the first embodiment. The width of n-type silicon semiconductor thin layer 5b is set to be the same on the bottom and side wall of first trench 7.

Since the steps subsequent to the step described with reference to FIG. 2(f) are the same with those according to the first embodiment, the subsequent steps are not illustrated herein. A gate oxide film is grown in second trench 8 and a gate electrode is formed by depositing a material that exhibits low electrical resistance such as polycrystalline silicon on the gate oxide film. Thus, a trench gate is formed. Then, a p-type channel region (p-type body region) is formed in the surface portion of the alternating conductivity type layer. Further, an n+ source region and a p+ contact region are formed in the surface portion of the p-type channel region.

Thus, the trench-gate SJ-MOSFET according to the second embodiment of the invention is manufactured.

According to the second embodiment, the trench gate is arranged in a self-aligning manner at a proper position as far as first trench 7 is formed within n-type region 27. However, since resist pattern 24 is formed again as an etching mask for forming first trench 7 after the alternating conductivity type layer is formed, the mask pattern alignment is liable to deviation. Even if a mask pattern alignment deviation is caused, ON-state resistance increase and such adverse effects are prevented from causing according to the invention. The reason for this will be described below in detail.

Figure 7A:
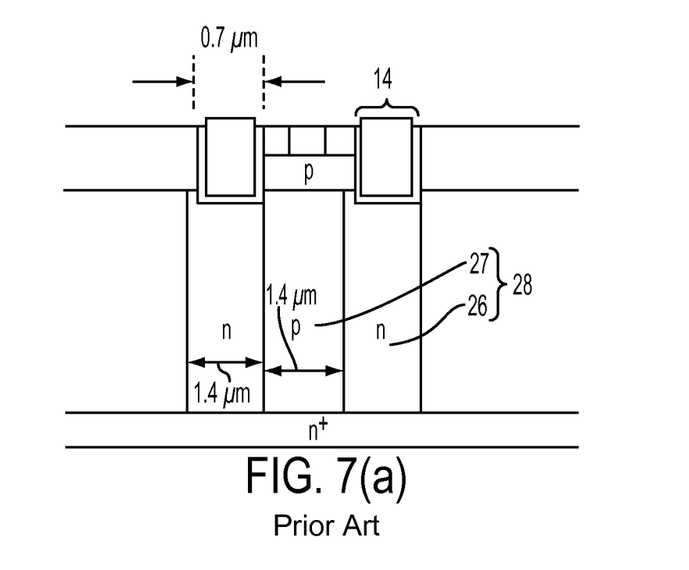
FIG. 7(a) is a cross sectional view describing the effects of the relative positional deviation between the alternating conductivity type and the trench gate caused by the conventional manufacturing method.
Figure 7B:
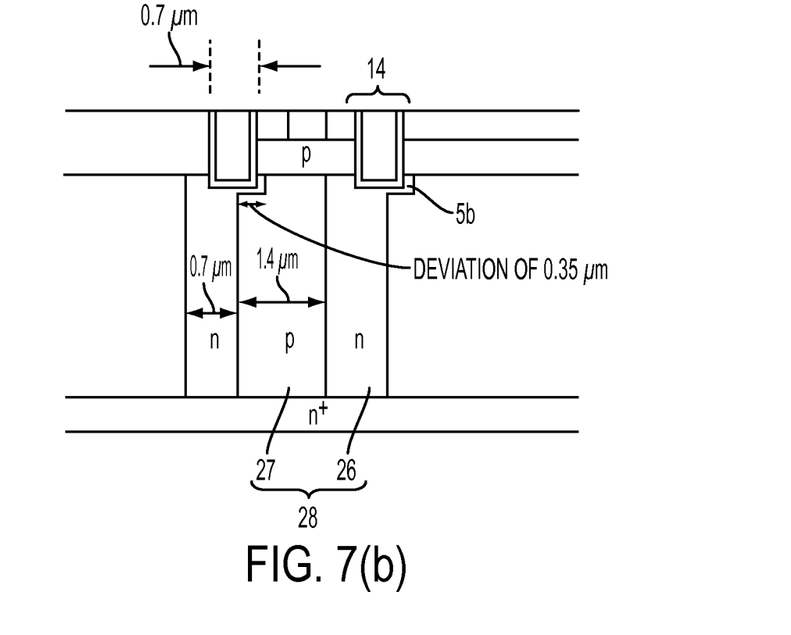
FIG. 7(b) is a cross sectional view describing the effects of the relative positional deviation between the alternating conductivity type and the trench gate caused by the manufacturing method according to the second embodiment.

FIG. 7(a) is a cross sectional view describing the effects of the relative positional deviation between alternating conductivity type layer 28 and trench gate 14 caused by the conventional manufacturing method. FIG. 7(b) is a cross sectional view describing the effects of the relative positional deviation between alternating conductivity type layer 28 and trench gate 14 caused by the manufacturing method according to the second embodiment.

Now it is assumed that p-type region 27 and n-type region 26 constituting alternating conductivity type layer 28 are set to be 1.4 µm in width and trench gate 14 is set to be 0.7 µm in width as described in FIG. 7(a). In the proper arrangement in the conventional structure, trench gate 14 is arranged originally in the upper central portion of n-type region 26. If a mask alignment deviation of 0.35 µm is caused in the relative position between trench gate 14 and n-type region 26, the trench gate 14 bottom will be in contact with the pn-junction between p-type region 27 and n-type region 26 in alternating conductivity type layer 28. In this case, a channel is caused in p-type region 27 in contact with trench gate 14 and the channel length is elongated by the contact portion, resulting in ON-state resistance increase.

In the case shown in FIG. 7(b) according to the second embodiment of the invention, it is assumed that a mask alignment deviation of 0.35 µm or longer is caused in the relative position between trench gate 14 and n-type region 26 due to the reformation of resist pattern 24 and repeated patterning. Even if the mask alignment deviation of 0.35 µm or longer is caused, n-type silicon semiconductor thin layer 5b will remain between the trench gate 14 bottom and n-type region 26 or between the trench gate 14 bottom and p-type region 27 without fail. Therefore, the channel will never be elongated as according to the conventional method. Therefore, the ON-state resistance will not increase.

As a result, the mutual positional deviation between trench gate 14 and n-type region 26 as long as the mask alignment deviation corresponding to the width of n-type region 26 in alternating conductivity type layer 28 is allowable according to the second embodiment of the invention.

The manufacturing method according to the second embodiment described above facilitates setting the trench gate to be narrower than the n-type region in the alternating conductivity type layer and positioning the trench gate in the center of the n-type region. Since any mask alignment deviation is not caused in principle, the ON-state resistance increase caused by the mask alignment deviation is prevented from occurring. Even if a mask alignment deviation is caused, the ON-state resistance is prevented from increasing. The p-type region width can be minimized to the extreme.

Third Embodiment

Now a method of manufacturing a trench-gate SJ-MOSFET according to a third embodiment of the invention will be described below with reference to FIGS. 3(a) through 3(f). According to the third embodiment, a trench-gate SJ-MOSFET is manufactured by a method that includes a process of forming an alternating conductivity type layer having a superjunction structure by trench-filling epitaxial growth.

Figure 3A:
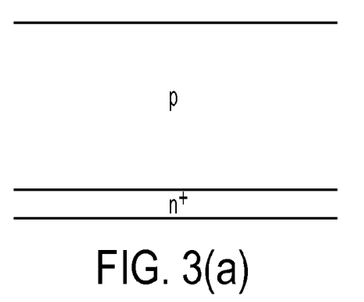
FIG. 3(a) is a first cross sectional view describing the process of manufacturing a trench-gate SJ-MOSFET according to a third embodiment of the invention.
Figure 3B:
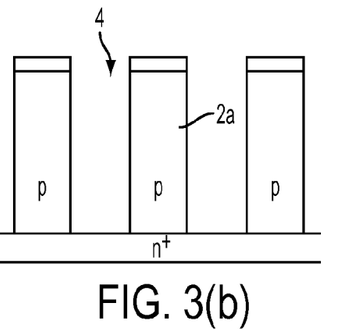
FIG. 3(b) is a second cross sectional view describing the process of manufacturing the trench-gate SJ-MOSFET according to the third embodiment.
Figure 3C:
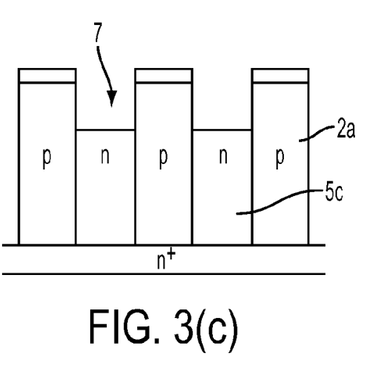
FIG. 3(c) is a third cross sectional view describing the process of manufacturing the trench-gate SJ-MOSFET according to the third embodiment.

The manufacturing method according to the third embodiment grows an epitaxial layer by plasma CVD using silane and such a silicon source gas in burying an n-type silicon semiconductor layer in third trench 4 for forming an alternating conductivity type layer by epitaxial growth as shown in FIG. 3(b), the same with FIG. 1(b) according to the first embodiment. The manufacturing method according to the third embodiment forms n-type region 5c by growing the epitaxial layer selectively from the third trench 4 bottom such that the epitaxial growth from the third trench 4 bottom predominates over the epitaxial growth from the third trench 4 side wall. The manufacturing method according to the third embodiment stops the epitaxial layer growth at a predetermined height to leave first trench 7 as shown in FIG. 3(c).

Figure 3D:
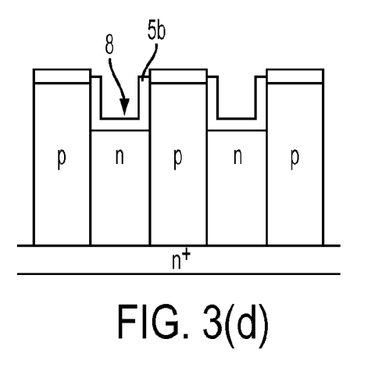
FIG. 3(d) is a fourth cross sectional view describing the process of manufacturing a trench-gate SJ-MOSFET according to the third embodiment of the invention.
Figure 3E:
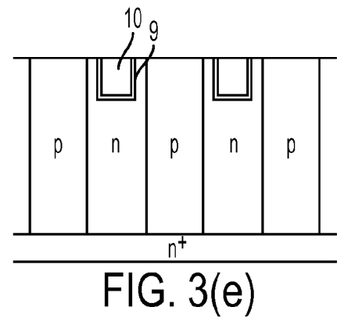
FIG. 3(e) is a fifth cross sectional view describing the process of manufacturing the trench-gate SJ-MOSFET according to the third embodiment.
Figure 3F:
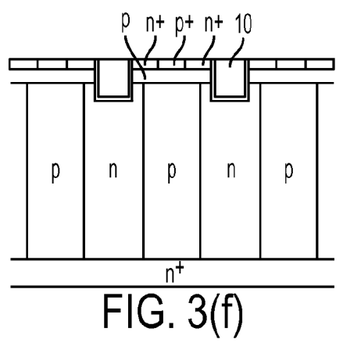
FIG. 3(f) is a sixth cross sectional view describing the process of manufacturing the trench-gate SJ-MOSFET according to the third embodiment.

Since the descriptions with reference to FIGS. 3(d) through 3(f) are the same with the descriptions with reference to FIGS. 1(e) through 1(g), duplicated descriptions will not be made.

Since n-type region 5c in the alternating conductivity type layer and first trench 7 for forming the trench gate are formed using the same oxide film mask, n-type region 5c and first trench 7 are arranged properly in a self-aligning manner. Therefore, any mutual positional deviation is not caused between n-type region 5c and first trench 7.

Now the steps of forming an alternating conductivity type layer by trench-filling epitaxial growth which are different from the steps of forming an alternating conductivity type layer according to the first embodiment will be described below in detail.

The crystal plane orientation of the side wall of third trench 4 for forming an alternating conductivity type layer is set at the orientation favorable for facet formation. An alternative method different from the plasma CVD method described above that uses silane may be employed. The alternative method conducts epitaxial growth selectively from the third trench 4 bottom feeding dichlorosilane gas and an etching gas simultaneously or alternately and repeatedly into a plasma CVD apparatus and stops the epitaxial growth at a predetermined height leaving first trench 7 to form n-type region 5c as shown in FIG. 3(c).

According to the alternative method, the trench side wall is stabilized by the facet formation and the epitaxial growth on the third trench 4 side wall is suppressed by the etching gas. Therefore, the epitaxial growth speed on the third trench 4 side wall is slower than the epitaxial growth speed on the third trench 4 bottom. If the carrier gas pressure during the etching is set to be low, the etching gas concentration in the third trench 4 bottom and the etching gas concentration in the vicinity of the third trench 4 opening will be almost the same. Therefore, the etching proceeds at the same speed in entire third trench 4 and the third trench 4 inner surface is smoothed because of the facet formation. Therefore, third trench 4 is filled with an epitaxial layer exhibiting a high crystal quality to a predetermined height such that first trench 7 is left.

Since the epitaxial growth speed in the third trench 4 opening becomes slow due to the etching effect of the etching gas mixed slightly, the epitaxial growth speed in the third trench 4 bottom is made to be faster relatively. Therefore, third trench 4 is filled with n-type silicon semiconductor layer 5c from the bottom thereof gradually. As soon as n-type silicon semiconductor layer 5c reaches a predetermined height, the growth gas feed is stopped and only the etching gas feed is continued to remove the silicon layer on the trench side wall. Then, the space above n-type silicon semiconductor layer 5c is left as first trench 7. Due to the mix of an etching gas, the film thickness uniformity is improved.

Figure 4A:
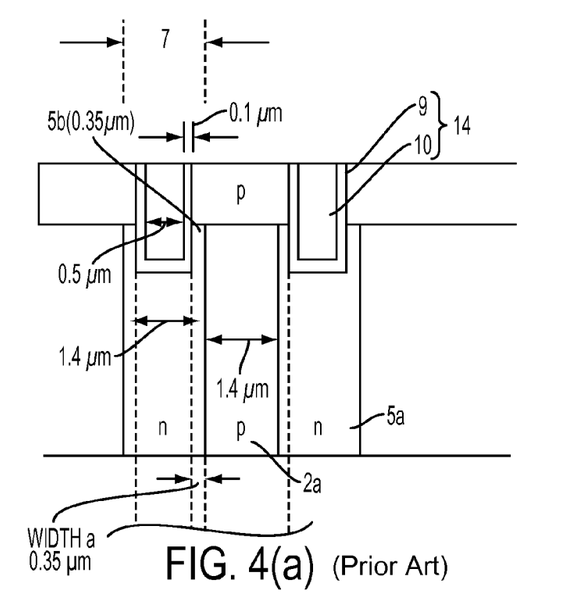
FIG. 4(a) is a cross sectional view of an alternating conductivity type layer describing the typical dimensions of the constituent regions and the trench gate manufactured by the conventional method.
Figure 4B:
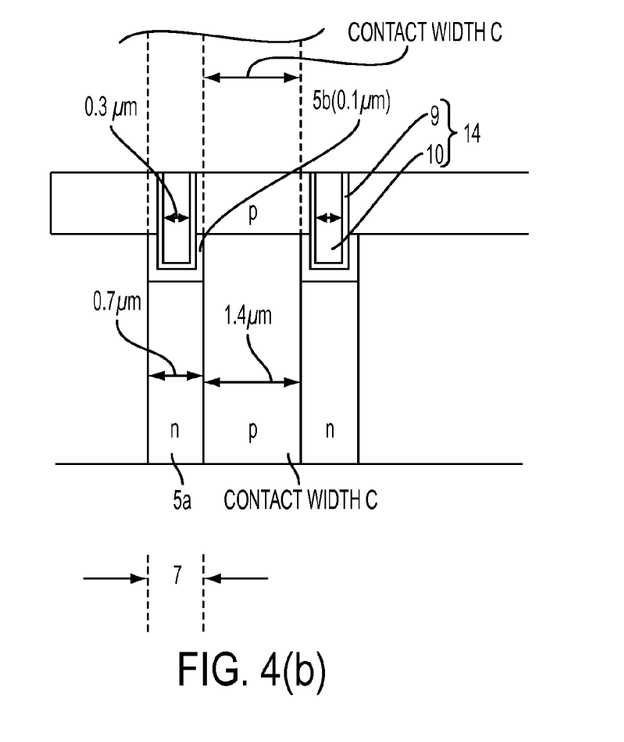
FIG. 4(b) is a cross sectional view of an alternating conductivity type layer describing the reduced dimensions of the constituent regions and the trench gate manufactured by any of the methods according to embodiments of the invention.

By the manufacturing methods according to the first through third embodiments, trench gate 14 is arranged in a self-aligning manner inside n-type region 5a in the alternating conductivity type layer without being positioned across the n-type region 5a boundary as shown in FIG. 4. The merits of arranging the alternating conductivity type layer and trench gate 14 without causing any mutual positional deviation will be described below in detail.

If the first trench 7 width is changed from 1.4 μm (FIG. 4(a)) to 0.7 μm (FIG. 4(b)), the gate oxide film 9 thickness is fixed at 0.1 μm, the thickness of n-type silicon semiconductor thin film 5b formed on the first trench 7 inner surface is changed from 0.35 μm to 0.1 μm, and the gate electrode width is changed from 0.5 μm to 0.3 μm, the trench gate will be housed in first trench 7.

As far as the conventional manufacturing method is employed, the width a value, that is half the difference between the first trench 7 width and the trench gate width, cannot be reduced from 0.35 μm, since it is necessary to consider a certain mask alignment deviation. Therefore, if the first trench 7 width is narrowed from 1.4 μm to 0.7 μm, there will not be any room to accept the trench gate. Therefore, it is impossible to house the trench gate in first trench 7. It is necessary for the minimum dimension of the conventional source contact section, that is the distance between the adjacent trench gates, to be (the p-type region width in the alternating conductivity type layer+2×width a of 0.35 μm or wider). As a result, if the gate electrode width is narrowed from 0.5 μm to 0.3 μm, it will be impossible to set the first trench 7 width to be 1.2 μm or narrower.

By the manufacturing methods according to the invention, it is possible to reduce the p-type region 2a width to contact width C, although the reduction is limited by the contact rule on the surface structure. In detail, if the n-type region 5a width is set to be 0.7 μm and contact width C to be 1.4 μm, the same with the conventional p-type layer width, it is possible to minimize the repeating pitch in the alternating conductivity type layer from 2.8 μm to 2.1 μm.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method of manufacturing a super-junction semiconductor device, the method comprising:
    growing an alternating conductivity type layer epitaxially on a heavily doped semiconductor substrate of a first conductivity type, the alternating conductivity type layer comprising a first semiconductor regions of the first conductivity type and a second semiconductor region of a second conductivity type, the first and second semiconductor regions extending in perpendicular to a major surface of the semiconductor substrate, the first and second semiconductor regions being arranged alternately and repeatedly in parallel to the major surface of the semiconductor substrate such that the first and second semiconductor regions are adjoining to each other;
    forming a first trench having a predetermined depth in a surface portion of the first semiconductor region;
    forming a thin layer of the first conductivity type on an inner surface of the first trench for forming a second trench surrounded by the thin layer of the first conductivity type; and
    burying a gate electrode in the second trench with a gate oxide film interposed between the gate electrode and the second trench.

2. The method according to claim 1, wherein the forming the alternating conductivity type layer comprises a multi-step epitaxial growth that repeats the epitaxially growing a same alternating conductivity type layer pattern multiple times.

3. The method according to claim 2, wherein the first trench for forming a trench gate is set to be narrower than the first semiconductor region in the alternating conductivity type layer.

4. The method according to claim 3, wherein the super-junction semiconductor device comprises a super-junction MOSFET.

5. The method according to claim 2, wherein the super-junction semiconductor device comprises a super-junction MOSFET.

6. The method according to claim 1, wherein the forming the alternating conductivity type layer comprises:
   growing an epitaxial layer of the second conductivity type for a predetermined thickness on the semiconductor substrate;
   forming a third trench for forming the first semiconductor region, the third trench being extended from a surface of the epitaxial layer of the second conductivity type to the semiconductor substrate; and
   burying an epitaxial layer of the first conductivity type in the third trench.

7. The method according to claim 6, wherein a same insulator film mask is used for forming the third trench and for forming the first trench.

8. The method according to claim 7, wherein the super-junction semiconductor device comprises a super-junction MOSFET.

9. The method according to claim 6, wherein the epitaxial layer of the first conductivity type is selectively grown epitaxially from a bottom of the third trench and the epitaxial growth of the epitaxial layer of the first conductivity type is stopped at a predetermined height for forming the first trench having the predetermined depth.

10. The method according to claim 9, wherein the super-junction semiconductor device comprises a super-junction MOSFET.

11. The method according to claim 9, wherein the epitaxial growth of the epitaxial layer of the first conductivity type is performed by plasma CVD using silane and a silicon source gas.

12. The method according to claim 11, wherein the super-junction semiconductor device comprises a super-junction MOSFET.

13. The method according to claim 9, wherein the epitaxial growth of the epitaxial layer of the first conductivity type is performed while feeding a dichlorosilane gas and an etching gas simultaneously or alternately and repeatedly into a plasma CVD apparatus.

14. The method according to claim 13, wherein the super-junction semiconductor device comprises a super-junction MOSFET.

15. The method according to claim 6, wherein the super-junction semiconductor device comprises a super-junction MOSFET.

16. The method according to claim 1, wherein the super-junction semiconductor device comprises a super-junction MOSFET.

17. The method according to claim 1, wherein the thin layer is the same in thickness on a side wall of the first trench and on a bottom of the first trench.

18. The method according to claim 17, wherein the super-junction semiconductor device comprises a super-junction MOSFET.

* * * * *